(12) United States Patent
Manger et al.

(10) Patent No.: US 7,760,345 B2
(45) Date of Patent: Jul. 20, 2010

(54) METHOD AND APPARATUS FOR DETERMINING AT LEAST ONE OPTICAL PROPERTY OF AN IMAGING OPTICAL SYSTEM

(75) Inventors: Matthias Manger, Aalen-Unterkochen (DE); Markus Goeppert, Aalen (DE); Gordon Doering, Hamburg (DE); Alfred Gatzweiler, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 371 days.

(21) Appl. No.: 11/942,507

(22) Filed: Nov. 19, 2007

(65) Prior Publication Data
US 2008/0204729 A1 Aug. 28, 2008

(30) Foreign Application Priority Data
Nov. 22, 2006 (DE) ........................ 10 2006 055 069

(51) Int. Cl.
*G01B 9/00* (2006.01)
(52) U.S. Cl. ........................ 356/124; 356/127; 355/55
(58) Field of Classification Search ......... 356/121–127, 356/399–401; 355/53, 55, 77
See application file for complete search history.

(56) References Cited

U.S. PATENT DOCUMENTS

| | | | |
|---|---|---|---|
| 5,925,887 A | 7/1999 | Sakai et al. | |
| 6,360,012 B1 | 3/2002 | Kreuzer | |
| 6,859,264 B2 | 2/2005 | Nakauchi et al. | |
| 6,972,836 B2 * | 12/2005 | Sato et al. ................... | 356/121 |
| 7,193,713 B2 * | 3/2007 | Shiode ........................ | 356/399 |
| 2006/0012799 A1 | 1/2006 | Wegmann | |
| 2006/0103826 A1 | 5/2006 | Kok et al. | |
| 2006/0244950 A1 * | 11/2006 | Wegmann .................... | 356/124 |
| 2008/0180688 A1 * | 7/2008 | Mengel et al. .............. | 356/515 |
| 2008/0252876 A1 * | 10/2008 | Mengel et al. ................ | 356/51 |
| 2009/0274964 A1 * | 11/2009 | Ohsaki ........................ | 430/30 |

FOREIGN PATENT DOCUMENTS

| | | |
|---|---|---|
| DE | 103 28 145 A1 | 1/2005 |
| DE | 10 2005 026 628 A1 | 12/2005 |
| WO | WO 2005/106952 A2 | 11/2005 |

OTHER PUBLICATIONS

Kirk et al., "Pinholes and pupil fills," Microlithography World, Autumn 1997, p. 25-34.

\* cited by examiner

*Primary Examiner*—Hoa Q Pham
(74) *Attorney, Agent, or Firm*—Sughrue Mion, PLLC

(57) ABSTRACT

A method and an apparatus for determining at least one optical property of an imaging optical system which is designed to image an object disposed in an object plane of the optical system into an assigned image plane. The method includes disposing at least one test structure in the object plane of the optical system, disposing an image recording device in at least two different positions relative to the image plane of the optical system, in each of the at least two relative positions the image recording device being offset in relation to the image plane to such an extent that an image of the pupil of the optical system is produced respectively on the image recording device by the optical system by means of the test structure, and recording an image produced on the image recording device by the optical system by means of the test structure in each of the at least two relative positions by means of the image recording device.

31 Claims, 3 Drawing Sheets

METHOD AND APPARATUS FOR DETERMINING AT LEAST ONE OPTICAL PROPERTY OF AN IMAGING OPTICAL SYSTEM

BACKGROUND TO THE INVENTION

The invention relates to a method for determining at least one optical property of an imaging optical system which is designed to image an object disposed in an object plane of the optical system into an assigned image plane. Moreover, the invention relates to an apparatus for determining at least one optical property of an imaging optical system which is designed to image an object disposed in an object plane of the optical system into an assigned image plane. Moreover, the invention relates to a microlithography exposure tool with an illumination system and/or a projection objective and an apparatus of this type.

An optical property of an imaging optical system which can be determined by means of this type of method or this type of apparatus can for example be the numerical aperture or the telecentricity of the optical system. The numerical aperture of an optical system is a dimension-free number which describes an angular region for the inlet and for the outlet of electromagnetic radiation into the optical system. The numerical aperture of an optical system, such as for example of a projection objective of a microlithography exposure tool is defined as follows:

$$NA = n \times \sin\theta \quad (1)$$

n being the refractive index of the medium surrounding the optical system and $\theta$ being half the opening angle of the maximum inlet cone for electromagnetic radiation passing into the optical system or of the maximum outlet cone for radiation leaving the optical system.

Previously known methods for determining the numerical aperture of an imaging optical system measure the electromagnetic radiation passing out of the system by means of an interferometer. The precision of the determination of the numerical aperture of the optical system by means of the interferometric method is limited, however. Measuring the variation in the numerical aperture across the image field of the optical system is also very laborious here.

It is known that determining the telecentricity of an optical system serves to identify deviations of the telecentricity characteristics of optical imaging systems from their ideal telecentricity characteristics of optical imaging systems, i.e. telecentricity errors. With an imaging optical system which is associated with a telecentricity error the main beam for a respective field point does not extend, as in the error-free case, parallel to the optical axis of the imaging system, but rather tilted in relation to the latter, the tilt angle being a quantitative measure of the telecentricity error. It is obvious to determine the telecentricity error here by the energetic centre point position of the image of a respective field point in the image plane of the optical system being measured in different focus adjustments and from this the tilt angle is calculated trigonometrically. Opposing this, however, is the difficulty that the energetic centre point position of the image of a respective field point can also vary in the image plane independently of the focus adjustment due to other image errors with which imaging systems are typically associated, such as for example coma and image field curvature errors. Consequently, from this type of measurement of the energetic centre point position in the image plane as a function of the focus setting alone one can only draw conclusions regarding the telecentricity error with a high level of imprecision.

UNDERLYING OBJECT

It is an object of the invention to provide a method of the type specified at the start and a microlithography exposure tool with an apparatus of the type specified at the start by means of which an optical property of the imaging optical system, in particular the numerical aperture and/or the telecentricity of the optical system, can be determined with improved precision.

SOLUTION ACCORDING TO THE INVENTION

This object is achieved according to the invention with a generic method which has the following steps: disposing at least one test structure, for example in the form of a pinhole of an aperture mask, in the object plane of the optical system, disposing an image recording device in at least two different relative positions relative to the image plane of the optical system, in each of the at least two relative positions the image recording device being offset in relation to the image plane to such an extent that an image of the pupil of the optical system is produced respectively on the image recording device by the optical system by means of the test structure, and recording an image produced on the image recording device by the optical system by means of the test structure in each of the at least two relative positions by means of the image recording device. Furthermore, the object is achieved according to the invention with a generic method which has the following steps: disposing at least one test structure in the object plane of the optical system, disposing an image recording device in at least two different relative positions relative to the image plane of the optical system, in each of the at least two relative positions the image recording device being offset in relation to the image plane to such an extent that an image is produced respectively on the image recording device by the optical system by means of the test structure wherein the maximum extension of the image exceeds a maximum extension of the image of the test structure in the image plane by at least one order of magnitude, and recording an image produced on the image recording device by the optical system by means of the test structure in each of the at least two relative positions by means of the image recording device.

Furthermore, the object according to the invention is achieved with a generic apparatus which has at least a test structure and an image recording device, the apparatus being designed to dispose the at least one test structure in the object plane of the optical system and the image recording device in at least two different relative positions relative to the image plane of the optical system, in each of the at least two relative positions the image recording device being offset in relation to the image plane to such an extent that an image of the pupil of the optical system is respectively produced on the image recording device by the optical system by means of the test structure, and the image recording device being designed to record an image produced on the image recording device by the optical system by means of the test structure in each of the at least two relative positions. Furthermore, the object according to the invention is achieved with a generic apparatus which is designed to dispose the at least one test structure in the object plane of the optical system and the image recording device in at least two different relative positions relative to the image plane of the optical system, in each of the at least two relative positions the image recording device being offset in relation to the image plane to such an extent that an image is respectively produced on the image recording device by the optical system by means of the test structure, wherein the maximum extension of the image exceeds a maximum extension of the image of the test structure in the image plane by at least one order of magnitude, and the image recording device being designed to record an image produced on the image recording device by the optical system by means of the test structure in each of the at least two relative positions. Moreover, the object is achieved according to the invention with a microlithography exposure tool such as, for example, a stepper or scanner with an illumination system and/or a projection objective with this type of apparatus for determining an imaging property of the illumination system and/or of the projection objective.

In other words, according to the invention a method and an apparatus are provided which make it possible to determine at least one optical property of an imaging optical system, in particular to determine the numerical aperture and/or the telecentricity of the optical system. The optical system is designed to image an object disposed in an object plane into an assigned image plane. A corresponding image plane is assigned here to every possible object plane in which the object can be disposed.

According to the invention at least one test structure is disposed in an object plane of the optical system. Furthermore, an image recording device is disposed in at least two different relative positions relative to the image plane of the optical system, i.e. at least two positions shifted in relation to one another along the optical axis of the optical system. In order to change between the relative positions the image recording device and/or the image plane of the optical system can be shifted. The image plane of the optical system can be offset, for example, by changing the position of the test structure relative to the optical system along the optical axis of the latter and so by offsetting the object plane.

According to a first embodiment of the solution according to the invention, in a first and a second relative position the image recording device is offset in relation to the image plane to such an extent that a respective image of the pupil of the optical system, for example in the form of a light spot, is produced on the image recording device by means of the test structure in each of the relative positions. The image of the pupil is produced optically here directly on the image recording device, i.e. the image of the pupil does not have to be established for example by evaluating, by calculation, a recorded structure, such as for example an interference pattern. The image recording device can be shifted extra- or intrafocally here in relation to the image plane.

In this context, the pupil of the optical system is understood as meaning in particular the outlet pupil of the optical system. Each optical system has an aperture diaphragm regulating the brightness of the image. In the case of a lens this can be formed by the edge of the lens or also be a blade aperture etc. disposed behind the optical elements of a multi-lens system. The outlet pupil of an optical system is the image of the aperture diaphragm, as can be seen from an axial point of the image plane through lenses of the optical system lying between the aperture diaphragm and the point in the image plane.

According to the invention the image recording device is disposed in the relative positions respectively in a plane in which by means of the test structure an image of the pupil is produced. This image of the pupil is in particular an image of the illumination of the pupil by means of illumination radiation used to produce the image on the image recording device. This type of image of the pupil illumination is also called a pupillogram. As regards the definition of a pupillogram, specific reference is made to the article by Joe Kirk and Christopher Progler, "Pinholes and pupil fills", Microlithography World, autumn 1997, pages 25-34. In other words, according to the invention the image recording device is disposed in the relative positions in positions in which the pupillogram can respectively be directly measured.

According to a second embodiment of the solution according to the invention, the image recording device is offset with respect to the image plane to such an extent that an image is produced on the image recording device by the optical system by means of the test structure, the maximum extension of which exceeds a maximum extension of the image of the test structure in the image plane by at least one order of magnitude. Therefore, the maximum extension of the image structure produced by means of the test structure should be at least ten times as great as the maximum extension of the test structure when imaging the latter in the image plane.

According to the invention an image produced on the image recording device by means of the test structure is thereupon recorded in each of the at least two relative positions. By means of these images at least one optical property of the optical system can thereupon be determined with a high level of precision. In particular, the numerical aperture and/or the telecentricity of the optical system can therefore be established with a high level of precision.

By means of the arrangement according to the invention of the image recording device in the two relative positions according to the first embodiment and the second embodiment of the solution according to the invention, the image produced by means of the test structure with focus errors which can be caused, for example, by deviations of the image recording device in the direction of the optical axis of the optical system, is hardly effected by image errors of the optical system caused by wave front deviations.

This type of image error, such as for example a coma error or other aberrations, are dependent upon the z position along the optical axis in a higher order. Due to the large distance between the image recording device and the image plane, and so the nominal focus position, the sensitivity to the image errors caused by wave front deviations is low with small changes along the optical axis. This reduced effect of the image errors caused by wave front deviations upon the measurement of the optical property contributes to improved precision of the method. This applies in particular to determination of the telecentricity of the optical system. The aforementioned image errors are in particular insignificant if the images produced on the image recording device in the at least two relative positions by means of the test structure respectively have an extension of at least 100 μm. The method according to the invention is a differential method. Therefore, contrary to the interferometric measuring method with which so-called defocus mapping is required, a calibration step is not required.

In an advantageous embodiment of the invention the image recording device in a first relative position is offset by at least 50 μm, and advantageously by 200-500 μm, in relation to the image plane. Advantageously, the optical system is operated with a wavelength in the UV wavelength range or with shorter wavelengths. With this type of illumination wavelength a focus offset of minimum 50 μm means that one can no longer talk of imaging the test structure onto the image recording device, but rather that the pupillogram of the optical system is made visible by means of the test structure. With this type of focus offset, image aberrations caused by wave front deviations have hardly any more effect upon determination of the optical property.

In a further advantageous embodiment, several test structures are disposed at different positions of an object field in the object plane. Furthermore, the object field is converted into an image field on the image recording device in each of the at least two relative positions of the optical system, and the respective image field is recorded by the image recording device, and from this the distribution of the optical property of the optical system is determined dependently upon the position in the image field. In other words, the method according to the invention is implemented in parallel for a plurality of test structures disposed in the object field. Therefore, the test structures form parallel measuring channels. By means of this parallelised measuring of the optical property over the whole image field of the optical system, the optical system can be measured with greater efficiency of time. Therefore, the optical system can be examined with regard to the distribution of the optical property over the image field after its production or also within the framework of maintenance without any great consumption of time.

Advantageously, the at least one optical property of the optical system is determined by evaluating the images recorded in the different relative positions. Furthermore, it is advantageous if the at least one determined optical property comprises the numerical aperture of the optical system. In particular, the numerical aperture on both the input side and on the output side is determined here. The numerical aperture on the output side ($NA_{output\ side}$) is connected here to the numerical aperture on the input side ($NA_{input\ side}$) by the imaging scale of the optical system as follows:

$$NA_{input\ side} = \text{imaging scale} \times NA_{output\ side} \quad (2)$$

Furthermore, it is advantageous for determining the numerical aperture of the optical system if the distance $d_o$ between the image recording device and the image plane in the first relative position conforms with the following relation:

$$d_0 \gg \frac{G_0}{\tan(\arcsin NA)} \quad (3)$$

$G_o$ being the maximum extension of the test structure in its image in the image plane, and NA being the numerical aperture on the output side of the optical system. Therefore, the distance $d_o$ should be substantially greater than the term specified in equation (3), and in particular by at least one order of magnitude. By means of the method according to the invention the numerical aperture can be determined absolutely with a resolution of less than 0.0001, i.e. 0.1 mNA.

Advantageously an extension, in particular a radius, of the image or light spot produced by means of the test structure is determined for each relative position and from this the numerical aperture of the optical system on the output side is calculated. Here in particular a radius change rate $dR/dz$ on a working point $z_o$, which advantageously corresponds to the position of the image recording device along the optical axis in the first relative position, is established from the radii R of the images of the test structures established for the different relative positions, and from this the numerical aperture NA is calculated as follows:

$$NA = \sin\left(\arctan\left(\frac{dR}{dz}\bigg|_{z_0}\right)\right) \quad (4)$$

In order to obtain the radius change $dR/dz$ the pupil radii R are advantageously extracted from a focus scale measurement $z_i$; i=1 . . . l implemented in order to set the different relative positions and plotted against the heights $z_i$. By linear regression the increases $dR/dz$ can then be evaluated. Furthermore, it is possible to characterise the objective aperture of the optical system from the images recorded in the different relative positions, in particular to determine deviations in the shape of the image from a desired shape, and from this to draw conclusions for example regarding vignetting and aperture lamination.

Furthermore, it is advantageous if the at least one determined optical property comprises the telecentricity of the optical system. The method according to the invention enables telecentricity measurement with a high dynamic. In this case it is advantageous if the distance between the image recording device and the image plane in the first relative position is at least one order of magnitude greater than the maximum extension of the test structure when imaging in the image plane.

In order to determine the telecentricity of the optical system the centre point or the mid point of the image or the light spot produced by means of the test structure is advantageously established for each relative position, and from this the telecentricity of the optical system on the output side or the image side is calculated. Advantageously, the image produced by means of the test structure has a circular edge. In this case when evaluating the images the coordinates X and Y of the centre points of the images are established in the different relative positions, advantageously by circle adaptation. The telecentricity F can then be established as follows:

$$F = \frac{d}{dz}\binom{X}{Y}\bigg|_{z_0} \quad (5)$$

$z_o$ being a working point for the distance between the image plane and the image recording device at which the position change rate $dX/dz$ or $dY/dz$ is determined.

Moreover, it is advantageous if the image recording device is set up for rastered image recording, and the size difference between the images recorded in the different relative positions along a recording direction is at least a distance between two raster points or pixels of the image recording device. The image recording device is advantageously in the form of a digital camera with a CCD or CMOS detector. With an advantageous distance between the raster points of the image recording device of maximum 5 μm the size difference between the images recorded in the different relative positions should also be at least 5 μm, and so the latter can be measured by means of the method according to the invention.

Furthermore, it is advantageous if the test structure is rounded in form, and in particular is circular in form. In this case the image produced on the image recording device by means of the test structure also has the roundest form possible, and this facilitates further evaluation in order to determine the numerical aperture or the telecentricity. In an alternative embodiment the test structure is of a shape deviating from the circular form. Therefore, when evaluating the images the effect of the shape of the test structure is taken into account by means of a correction algorithm.

Moreover, it is advantageous if the test structure is punctiform, in particular in the form of a punctiform opening in an aperture mask or of a punctiform radiation attenuating element in a mask which is basically permeable to radiation.

Here the test structure can be designed as a "positive" or as a "negative" pinhole. With this type of pinhole mask the pupil illumination of the optical system can be recorded particularly precisely. Advantageously the test structure is illuminated with electromagnetic radiation of a pre-specified illumination wavelength and is of dimensions such that a maximum extension of the image of the test structure produced in the image plane by means of the optical system is within the order of magnitude of the illumination wavelength, i.e. the maximum extension of the image of the test structure is maximum ten times the illumination wavelength.

Moreover, it is advantageous if the test structure is illuminated with high-grade incoherent electromagnetic radiation, i.e. with radiation with the greatest possible partial coherence σ. The partial coherence σ of the illumination radiation is defined by the quotient of the numerical aperture of an illumination system producing the electromagnetic radiation and the numerical aperture of the optical system. The illumination of the test structure with high-grade incoherent electromagnetic radiation makes it possible to "illuminate" the whole numerical aperture of the optical system and so to determine the numerical aperture or the telecentricity of the optical system with high precision. The illumination of the test structure with high-grade incoherent electromagnetic radiation can advantageously be achieved by flood illumination of the test structure. For this purpose a scatter disc disposed in the illumination optical path of the optical system can be used which is irradiated with the greatest possible partial coherence (e.g. σ of approximately 0.8). In an alternative embodiment a microlens focussing the illumination radiation onto the test structure can be provided. In this case the microlens should be illuminated with the smallest possible partial coherence (e.g. σ of approximately 0.3). The flood illumination of the test structure means that the illumination radiation illuminates the test structure from a large angular range. With this type of flood illumination the maximum extension of the test structure can also be substantially greater than the illumination wavelength. The flood illumination means that the effect of the test structure itself, even with an extension substantially greater in comparison with the illumination wavelength, remains that of a punctiform pinhole. In the case of test structures in the form of pinholes, a greater extension of the test structures becoming possible by means of the flood illumination has the advantage that a comparatively greater radiation intensity passes through the test structures, by means of which the measuring precision and speed of the method according to the invention is increased.

In a further advantageous embodiment, in at least a second relative position between the image recording device and the image plane the distance between the image recording device and the image plane is changed in relation to the first relative position by a small distance of for example a few μm in relation to the distance between the image recording device and the image plane in the first relative position. In particular, the distance is changed by a distance which is smaller by at least one order of magnitude than the distance between the image recording device and the image plane in the first relative position. In other words, a relative position which substantially corresponds to the first relative position is defined as the working point. The distance between the image plane and the image recording device varies between the different relative positions only by a relatively small amount around this working point. Advantageously a focus scale with an increment of approximately 2.5 μm is set about this working point. Therefore, the image produced on the image recording device by means of the test structure in each of the relative positions is an image of the pupil of the optical system or has a maximum extension which exceeds the maximum form of the image of the test structure in the image plane by at least one order of magnitude. In this case peripheral smearing in the image recorded by the image recording device between the relative positions does not change substantially so that its effect can remain disregarded. In an alternative embodiment the image recording device is located in a second relative position comparatively closer to the image plane, and in the extreme case even in the image plane itself. In this case the character of the peripheral smearing of the image on the image recording device changes substantially between the different relative positions. However, this change to the peripheral smearing can be predicted by means of a calculatory model. Therefore, its effect can be taken into account when evaluating the recorded images.

Furthermore, it is advantageous if the image recording device is shifted and/or tilted relative to the optical system in order to change between the different relative positions. The image recording device should be shifted parallel to the optical axis of the optical system here or be tilted relative to the latter.

Furthermore, it is advantageous if the at least one test structure is disposed on an object carrier, in particular on a mask for a microlithography exposure tool, and is shifted and/or tilted relative to the optical system in order to change between the different relative positions of the object carriers. Both the offsetting of the image recording device and of the object carrier relative to the optical system means that the distance between the image plane and the image recording device is changed or that the focus setting for the image produced by means of the test structure is changed.

In a further advantageous embodiment several test structures respectively offset in relation to one another parallel to the optical axis of the optical system are disposed on an object carrier, in particular a mask for a microlithography exposure tool. The images are produced in the different relative positions by means of test structures offset in relation to one another. In other words the object carrier has defined stages. Therefore, different image planes are assigned to the test structures disposed on the different stages. Therefore, by exposing the object carrier once images are produced in different relative positions on the image recording device. These can then be evaluated in order to determine the optical property.

Furthermore, it is advantageous if the optical property is determined on one or more optical systems of a microlithography exposure tool, in particular on a projection objective and/or an illumination system of the microlithography exposure tool.

Furthermore, it is advantageous if the at least one test structure is illuminated by means of an illumination system with an electromagnetic illumination radiation having a specific angular distribution in relation to the optical axis of the optical system, and the method further comprises the following step: determining an angularly resolved intensity distribution of the illumination radiation from the image recorded by the image recording device in the first relative position. The angular distribution of the electromagnetic radiation illuminating the test structure is determined by the so-called illumination setting of the illumination system. This type of illumination setting can comprise for example annular illumination, dipole illumination or quadrupole illumination. Therefore, in this embodiment of the method according to the invention the angular distribution of the illumination is determined in relation to the numerical aperture of the optical system. By setting different relative positions the numerical aperture, as already mentioned, can be determined with particularly high precision. By setting the numerical aperture in relation to the angularly resolved intensity distribution of the illumination radiation determined from the image recorded in the first relative position the angular distribution can be determined with particularly high absolute precision. With deviations of the determined angularly resolved intensity distribution from a desired intensity distribution correction measures can then be undertaken on the illumination system. Advantageously, in order to determine the angularly resolved intensity distribution a course of the boundary of the recorded image and a position of a region with increased radiation intensity, in particular of a light spot, disposed within the course of the boundary within the image, is determined, and from this the angularly resolved intensity distribution or the illumination setting is established in relation to an aperture diaphragm of the optical system.

The features specified with regard to the advantageous embodiments of the method according to the invention detailed above can be transferred correspondingly to the apparatus according to the invention. The advantageous embodiments of the apparatuses according to the invention resulting from this should be specifically included by the disclosure of the invention. Furthermore, the advantages detailed above with regard to the advantageous embodiments of the methods according to the invention therefore also relate to the corresponding advantageous embodiments of the apparatus according to the invention.

BRIEF DESCRIPTION OF THE DRAWINGS

In the following exemplary embodiments of a method according to the invention and of an apparatus according to the invention for determining at least one optical property of an imaging optical system are described in greater detail by means of the attached diagrammatic drawings. These show as follows:

In FIG. 1 a microlithography exposure tool 10 is shown. The microlithography exposure tool 10 has an illumination system 12 and an imaging optical system 14 in the form of a projection objective. The imaging optical system 14 has an optical axis 16 which extends parallel to the z axis of the cathesian xyz coordinate system indicated in FIG. 1. The optical system 14 is designed to image an object from an object plane 26 illuminated by the illumination system 12 into an assigned image plane 30. The optical system 14 has an aperture diaphragm which defines a bundle of rays 40 passing through the optical system 14. The image of the aperture diaphragm, as seen from an axial point of the image plane 30 through any lenses of the optical system 14 lying between the latter, is defined as the outlet pupil of the optical system 14 which in the following is only called the pupil 18. In the case shown diagrammatically in FIG. 1 the aperture diaphragm and the pupil 18 coincide with one another for the sake of simplicity.

Figure 1:
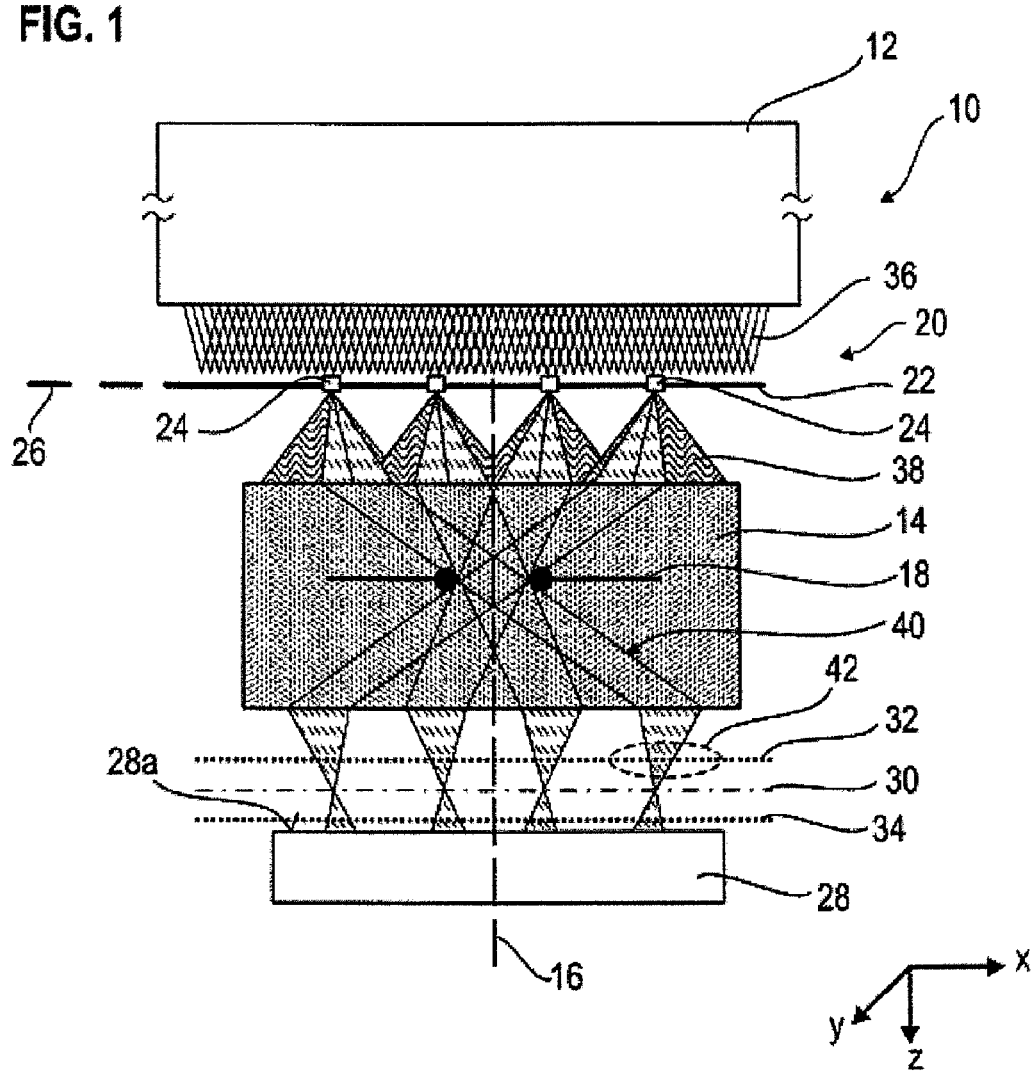
FIG. 1 a diagrammatic view of a microlithography projection exposure tool with projection optics and an apparatus for determining an optical property of the projection optics, FIG. 2 a course of the boundary of a light spot recorded by means of the apparatus according to FIG. 1, FIG. 3 a first embodiment of a mask used in the apparatus according to FIG. 1, FIG. 4 a second embodiment of a mask used in the apparatus according to FIG. 1, FIG. 5 a light spot recorded experimentally by means of the apparatus according to FIG. 1, FIG. 6 a circle fit of the light spot according to FIG. 5, FIG. 7 a histogram of the intensity distribution of the light spot according to FIG. 5, FIG. 8 an NA distribution over the image field of the projection optics of the assigned microlithography projection exposure tool according to FIG. 1 established by means of the apparatus according to FIG. 1, FIG. 9 an illustration of the production of a light spot having the pupil illumination of the projection optics according to FIG. 1 with so-called dipole illumination, and FIG. 10 a top view of the light spot according to FIG. 9.

The microlithography exposure tool 10 further comprises an apparatus 20 for determining an optical property of the imaging optical system 14. The apparatus 20 in turn comprises a reticle or a mask 22 with test structures 24 in the form of so-called pinholes disposed thereupon. Therefore, the mask 22 shown is an aperture mask. Alternatively however a mask which is basically permeable to radiation with punctiform test structures 24 impermeable to radiation can be used. These test structures 24 are distributed evenly over an object field which can be recorded by the optical system 14. The mask 22 is disposed in the object plane 26 of the optical system 14.

Figure 3:
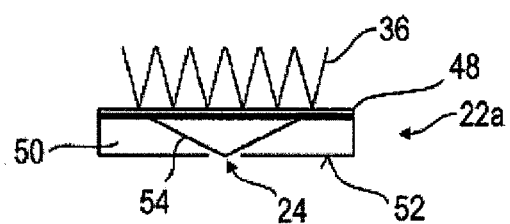
Figure 4:
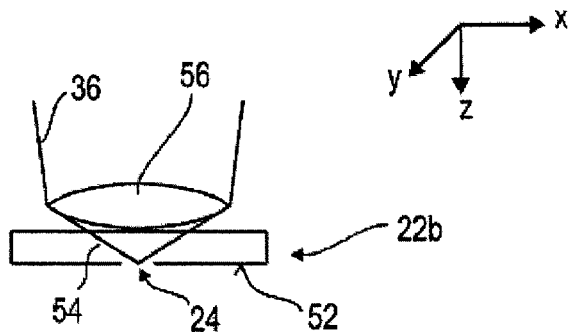

In a first embodiment of the mask 22 the test structures 24 are designed with a maximum extension which is within the order of magnitude of the illumination wavelength. FIG. 3 and FIG. 4 respectively show a section from further embodiments 22a and 22b of the mask of the apparatus 20. In relation to the first embodiment 22 of the mask, the test structures 24 according to FIGS. 3 and 4 can be larger. The advantage of this is that a radiation intensity which is greater by comparison passes through the test structures 24 in the form of pinholes, by means of which the measuring precision and speed of the method according to the invention is increased.

In order to nevertheless produce a broad radiation cone for the radiation 38 passing out of the test structures 24, the test structure 24 according to FIG. 3 and FIG. 4 are subjected to flood illumination. In the embodiment according to FIG. 3 the mask 22a has for this purpose a scatter disc 48 disposed on the top side of a main body 50 of the mask 22a which is permeable to radiation. The scatter disc 48 is irradiated with illumination radiation 36 of comparatively incoherent form (e.g. a of approximately 0.8). By means of the scatter disc 48 the illumination radiation 36 is converted into flood illumination 54 in relation to the test structure 24. The pinhole is a hole in a radiation-attenuating or -blocking layer 52 which covers a lower side of the main body 50 which is permeable to radiation. In the embodiment according to FIG. 4, instead of the scatter disc 48 a microlens 56 is disposed on the side of the main body 50 opposite the radiation-attenuating layer 52. The microlens 56 is irradiated with illumination radiation with a comparatively high coherence (e.g. σ of 0.3).

Moreover, the apparatus 20 comprises an image recording device 28 which can be in the form of a CCD camera for example. The image recording device 28 is disposed either in an intrafocal position 32 or in an extrafocal position 34. Here the two positions 32 and 34 are located away from the image plane 30 to such an extent that the light spot 42 produced on a detection surface 28a of the image recording device 28 by means of a test structure 24 is an image of the pupil 18 of the optical system 14. The image of the pupil 18 is an image of the illumination of the pupil 18 and is also referred to as a pupillogram in the following. The image of the pupil 18 is produced optically directly on the image recording device 28 in both positions 32 and 34, i.e. the image does not need to be established for example by calculatory evaluation of a recorded structure, such as for example an interference image.

The course of the electromagnetic radiation through the microlithography exposure tool 10 is as follows: the test structures 24 disposed on the mask 22 are irradiated by the illumination system 12 with illumination radiation 36 with a narrowly limited wavelength spectrum. The wavelength of the illumination radiation 36 generally comes within the UV range, but can also come within the range of shorter or longer wavelengths. The radiation 38 irradiated by the test structures 24 which are punctiform in relation to the illumination wavelength has a large angular distribution in relation to the optical axis 16. The bundle of rays 40 allowed to pass through the pupil 18 of the optical system 14 is only part of the radiation 38.

Figure 2:
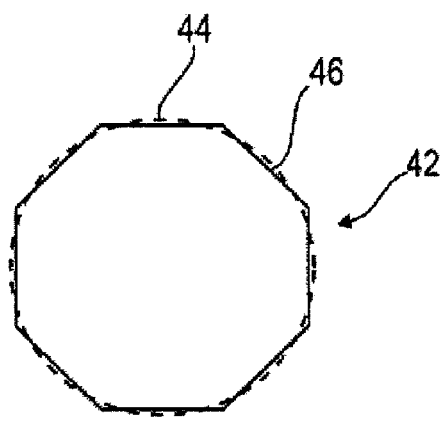

In FIG. 2 the course of the boundary 44 or 46 of the light spot 42 recorded by the image recording device 28 in the intrafocal position 32 is shown as a top view. Here reference number 46 indicates a real boundary course deviating somewhat from the circular shape, and reference number 46 the ideal boundary course of the light spot 42. The diameter of the light spot 42 exceeds the diameter of the image of a test structure 24 in the image plane 30 by at least one order of magnitude, i.e. by at least a factor of ten.

According to one embodiment of the method according to the invention the corresponding light spots 42 are recorded by means of the image recording device 28 at different positions shifted slightly in relation to the position 32 or 34. Here e.g. the position 32 can serve as the working point of a focus scale. In the specified embodiment the increment of the focus scale is small in relation to the distance between the working point and the image plane 30. The increment can be for example 2.5 µm. The light spots 42 recorded therefore for a given test structure 24 are therefore all pupillograms of the optical system 14 with different diameters and if applicable a different centre point position.

The radius R of the pupillograms 42 changes dependently upon the z position of the image recording device 28 at a working point $z_o$ at every field location (k, l) of the image field of the optical system 14 at which a light spot 42 is produced as a function of the numerical aperture NA of the optical system 14 as follows:

$$\left.\frac{dR(k,l;z)}{dz}\right|_{z_o} = \tan(\arcsin(NA(k,l))) \quad (6)$$

The reversal of this equation leads to $$NA(k,l) = \sin\left(\arctan\left(\left.\frac{dR(k,l;z)}{dz}\right|_{z_o}\right)\right) \quad (7)$$

In order to obtain the radius change dR(k,l; z)/dz the radii of the light spot or the pupil radii R(k,l; i)=R(k, l: $z_i$), i=1, ... l of a focus scale $z_i$, i=1, ... l are extracted and plotted against the heights $z_i$. By linear regression the increases dR(k, l; z)/dz are then evaluated for all field locations.

Figure 5:
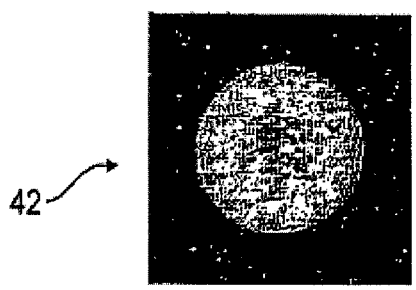

This means that in order to determine the numerical aperture of the optical system 14 only the radius change dR(k, l; z)/dz need be established for each light spot 42 in the image field 62. For this purpose the respective course of the boundary of the light spots 42 recorded by means of the image recording device 28 is first of all established. An example of this type of experimentally established light spot 42 is shown in FIG. 5. Here the recorded images of the light spot 42 are first of all released by an underground correction at selected peripheral regions of the background signal. Thereupon, respective histograms of the intensity modulation are established from the corrected intensity images.

Figure 6:
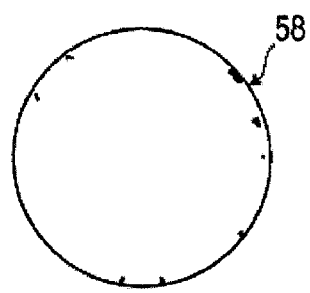
Figure 7:
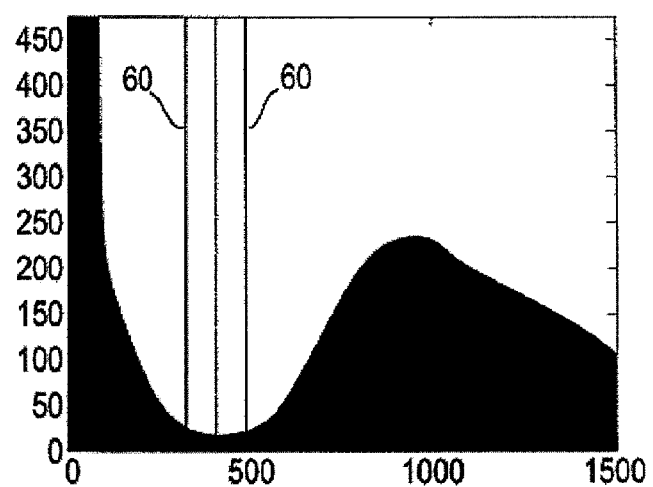

This type of histogram is shown for example in FIG. 7. By means of the histograms pixels which mark the boundary of the light spot 42 can form as minima. Intensity thresholds 60 are set around the minima so that a pre-specified number of pixels are evaluated. With the actual evaluation the centre points X (k,l; i), Y (k,l; i) and radii R (k,l; i) of the light spots 42 are obtained from the coordinates $x_n$(k,l:i), $y_n$(k,l; i) of the selected pixels (n=1), . . . N (k,l; i) by means of circle adaptation. By means of special runaway filtration by means of the residues only those pixels the residues of which are to be found within the statistically determined 3 sigma band, are subjected to evaluation. By means of this filtration the circle adaptation becomes very robust with respect to fraying, local intensity interruptions or other defects in the light spot 42. A circle fit 58 established by means of this method is shown for example in FIG. 6.

Figure 8:
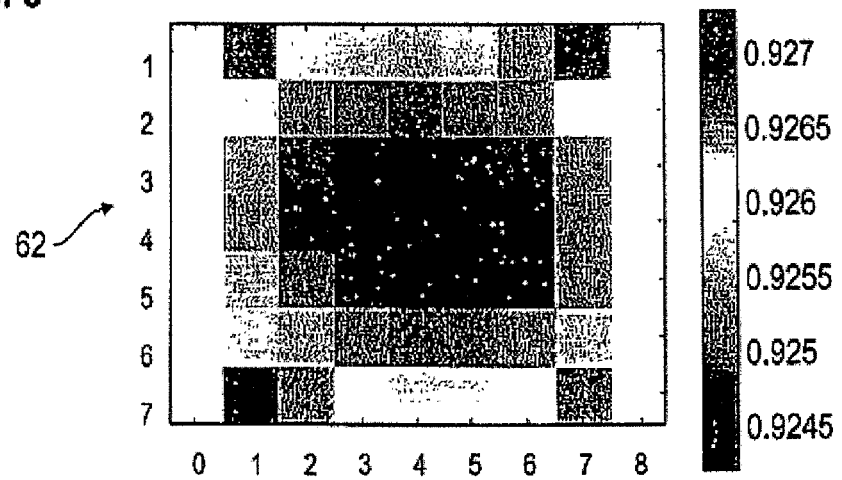

Finally, by means of the correlation $$R(k,l;i) = R(k,l;0) + \left(\frac{dR(k,l)}{dz}\right)z_i \quad (8)$$

the determining radii are plotted against the z positions of the image recording device 28 and the increases dR(k,l; z)/dz obtained by linear regression. FIG. 8 shows as an example an NA distribution over the image field 64 of the optical system 14 determined by means of the apparatus according to FIG. 1.

As well as the radii the coordinates X (k, l, i) and Y (k, l; i) of the centre points of the light spots 42 for the different z positions of the image recording device 28 result from the circle adaptation. By means of a method similar to the NA evaluation method the change dX(k, l; z)/dz and dy(k, l; z)/dz to the centre points is established at a working point $z_o$. From this the telecentricity of the optical system 14 on the output side can be deduced over the whole image field as follows:

$$\vec{F}(k,l) = \frac{d}{dz}\left(\begin{array}{c}X(k,l;z)\\Y(k,l;z)\end{array}\right)\bigg|_{z_0} \quad (9)$$

Figure 9:
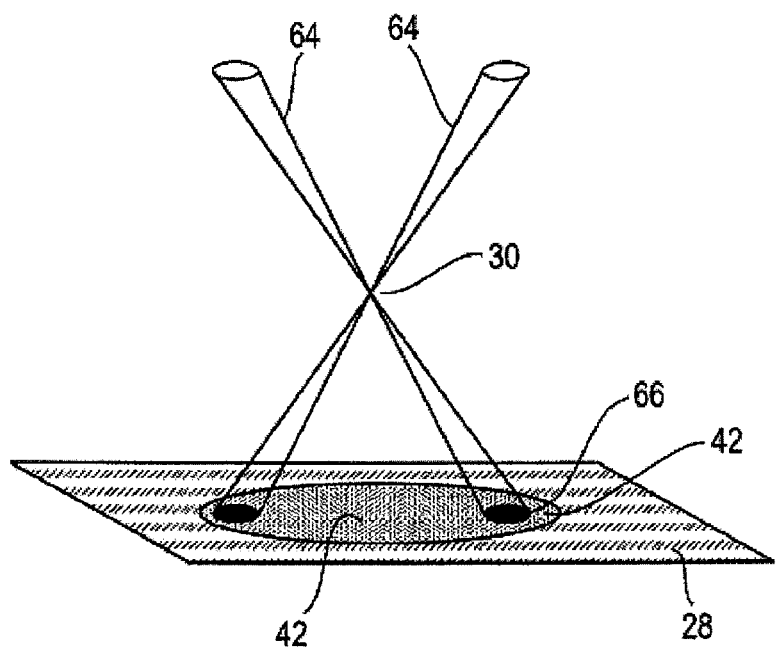
Figure 10:
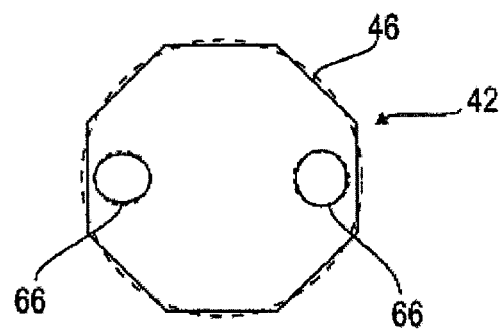

Furthermore, by means of the apparatus 20 according to FIG. 1 by disposing the image recording device 28 in e.g. one of the positions 32 and 34 the illumination setting of the illumination system 12 can be measured. The illumination setting defines a specific angular distribution of the illumination radiation 36 radiating onto the test structure 24 in relation to the optical axis 16. In the plane of the pupil 18 the illumination radiation 36 produces a corresponding intensity distribution which can be made visible by means of the image recording device 28 by disposing the latter in the aforementioned position. FIG. 9 shows this on the example of a dipole setting of the illumination. The radiation passing out of the optical system 14 with this type of dipole setting has two radiation cones 64. These coincide in the image plane 30, i.e. on the focus position of the optical system 14. By disposing the image recording device 28 in the position 32 or 34 the two radiation cones 64 image two disc-shaped images 66 of a sub-aperture of the illumination system 12 on the image recording device 28. The images 66 are located within a light spot 42 which, as already mentioned, is an image of the aperture or of the pupil 18 of the optical system 14. FIG. 10 shows the light spot 42 according to FIG. 9 in a top view. Due to the high measuring precision for the numerical aperture of the optical system 14, by means of the method according to the invention the illumination setting can also be determined with high absolute precision.

According to FIG. 1 the apparatus 20 is integrated into the microlithography exposure tool 10; alternatively it can be in the form of an independent measuring station into which e.g. a projection objective is introduced into the exposure tool 10 prior to installation for measuring. Transparent plane plates can be located, for example, in the optical path between the optical system 14 and the image recording device 28. These do not produce any diffraction so that the light spots 42 recorded are not additionally smeared. However, continuous image gratings can alternatively also be introduced into the optical path between the optical system 14 and the image recording device 28. In this case, however, the image recording device 28 must be shifted in relation to the image plane 30 to such an extent that the spatial modulations in the interferogram produced by the image grating are not resolved any further due to their high local frequencies.

In order that the pupil boundary maceration due to the diffraction (effective enlargement of the pupil) on the image grating remains controllable, the modulation region of the focus scale is to be chosen such that the induced pupil radius change remains small in comparison with the pupil radius at the working point $z_o$. In the event that gratings are provided in the optical path between the optical system 14 and the image recording device 28, the use of parcelled or patched gratings is advantageous.

LIST OF REFERENCE NUMBERS

| | |
|---|---|
| 10 | microlithography exposure tool |
| 12 | illumination system |
| 14 | imaging optical system |
| 16 | optical axis |
| 18 | pupil |
| 20 | apparatus for determining an optical property |
| 22 | mask |
| 22a | mask |
| 22b | mask |
| 24 | test structure |
| 26 | object plane |
| 28 | image recording device |
| 28a | detection surface |
| 30 | image plane |
| 32 | intrafocal position |
| 34 | extrafocal position |
| 36 | illumination radiation |
| 38 | outgoing radiation |
| 40 | radiation bundle passing through |
| 42 | light spot |
| 44 | ideal course of the boundary |
| 46 | real course of the boundary |
| 48 | scatter disc |
| 50 | main body permeable to radiation |
| 52 | radiation-attenuating or -blocking layer |
| 54 | flood illumination |
| 56 | microlens |
| 58 | circle fit |
| 60 | intensity threshold |
| 62 | image field |
| 64 | radiation cone |
| 66 | image of the illumination sub-aperture |

The invention claimed is:

1. A method for determining at least one optical property of an imaging optical system designed to image an object disposed in an object plane of the optical system into an assigned image plane, comprising:

disposing at least one test structure in the object plane of the optical system, disposing an image recording device in at least two different relative positions relative to the image plane of the optical system, wherein, in each of the at least two relative positions, the image recording device is offset in relation to the image plane to such an extent that an image of the pupil of the optical system is produced respectively on the image recording device by the optical system by means of the test structure, and recording an image produced on the image recording device by the optical system by means of the test structure in each of the at least two relative positions by means of the image recording device.

2. The method according to claim 1, wherein
the image of the pupil produced on the image recording device has a maximum extension which exceeds a maximum extension of the image of the test structure in the image plane by at least one order of magnitude.

3. The method according to claim 1, wherein
the image produced on the image recording device in a first relative position by means of the test structure has a maximum extension of at least 100 μm.

4. The method according to claim 1, wherein
the image recording device in a first of the relative positions is offset by at least 50 μm in relation to the image plane.

5. The method according to claim 1, wherein
several test structures are disposed at different positions of an object field in the object plane, the object field is converted into an image field on the image recording device in each of the at least two relative positions of the optical system, the respective image field is recorded by the image recording device, and the distribution of the optical property of the optical system is determined therefrom in dependence upon the position in the image field.

6. The method according to claim 1, further comprising:
determining the at least one optical property of the optical system by evaluating the images recorded in the different relative positions.

7. The method according to claim 1, wherein
the at least one optical property comprises the numerical aperture of the optical system.

8. The method according to claim 7, wherein
the numerical aperture of the optical system is determined absolutely with a resolution of less than 0.0001.

9. The method according to claim 1, further comprising:
establishing an extension, of the image produced by means of the test structure for each relative position, and calculating the numerical aperture of the optical system on the output side therefrom.

10. The method according to claim 1, wherein
the at least one optical property comprises the telecentricity of the optical system.

11. The method according to claim 1, further comprising:
establishing the center point of the image produced by means of the test structure, for each relative position, and calculating the telecentricity of the optical system on the output side is therefrom.

12. The method according to claim 1, wherein
the image recording device performs rastered image recording, and a size difference between images recorded in the different relative positions along a recording direction is at least a distance between two raster points of the image recording device.

13. The method according to claim 1, wherein the test structure is rounded in form.

14. The method according to claim 1, wherein the test structure is punctiform.

15. The method according to claim 14, wherein the test structure is in the form of a punctiform opening in an aperture mask or of a punctiform radiation attenuating element in a mask which is at least partially permeable to radiation.

16. The method according to claim 1, wherein the test structure is illuminated with electromagnetic radiation of a predetermined illumination wavelength, and the test structure is of dimensions such that a maximum extension of the image of the test structure produced in the image plane by means of the optical system is within the order of magnitude of the illumination wavelength.

17. The method according to claim 1, wherein the test structure is illuminated with high-grade incoherent electromagnetic radiation.

18. The method according to claim 1, wherein at least one of a scatter disc is disposed in the illumination optical path of the optical system and a microlens is focused upon the test structure, for the flood illumination of the test structure in relation to the input aperture.

19. The method according to claim 1, further comprising: in at least a second relative position between the image recording device and the image plane, changing the distance between the image recording device and the image plane in relation to a first relative position by a small distance in relation to the distance between the image recording device and the image plane in the first relative position.

20. The method according to claim 19, wherein in at least the second relative position between the image recording device and the image plane, the distance between the image recording device and the image plane is changed in relation to a first relative position by a distance which is smaller by at least one order of magnitude than the distance between the image recording device and the image plane in the first relative position.

21. The method according to claim 1, wherein the image recording device is at least one of shifted and tilted relative to the optical system, in order to change between the different relative positions.

22. The method according to claim 1, wherein the at least one test structure is disposed on an object carrier and the object carrier is at least one of shifted and tilted relative to the optical system, in order to change between the different relative positions.

23. The method according to claim 1, wherein a plurality of the test structures, respectively offset in relation to one another parallel to the optical axis of the optical system, are disposed on an object carrier, and the images are produced in the different relative positions by means of one of the respective test structures offset in relation to the others of the test structures.

24. The method according to claim 1, wherein the optical property is determined on at least optical system of a microlithography exposure tool.

25. The method according to claim 1, further comprising: illuminating the at least one test structure by means of an illumination system with an electromagnetic illumination radiation having a specific angular distribution in relation to the optical axis of the optical system, and determining an angularly resolved intensity distribution of the illumination radiation from the image recorded by the image recording device in a first relative position.

26. The method according to claim 25, further comprising: in order to determine the angularly resolved intensity distribution, determining a course of the boundary of the recorded image and a position of a region disposed within the course of the boundary with increased radiation intensity within the image, and establishing therefrom the angularly resolved intensity distribution in relation to an aperture diaphragm of the optical system.

27. A method for determining at least one optical property of an imaging optical system which is designed to image an object disposed in an object plane of the optical system into an assigned image plane, comprising:
disposing at least one test structure in the object plane of the optical system,
disposing an image recording device in at least two different relative positions relative to the image plane of the optical system, wherein, in each of the at least two relative positions, the image recording device is offset in relation to the image plane to such an extent that an image is produced respectively on the image recording device by the optical system by means of the test structure, wherein the maximum extension of the image exceeds a maximum extension of the image of the test structure in the image plane by at least one order of magnitude, and
recording an image produced on the image recording device by the optical system by means of the test structure in each of the at least two relative positions by means of the image recording device.

28. An apparatus for determining at least one optical property of an imaging optical system, the optical system being designed to image an object disposed in an object plane of the optical system into an assigned image plane, comprising:
at least one test structure;
an image recording device;
an arrangement disposing the at least one test structure in the object plane of the optical system and the image recording device in at least two different relative positions relative to the image plane of the optical system, and in each of the at least two relative positions, disposing the image recording device offset in relation to the image plane to such an extent that an image of the pupil of the optical system is respectively produced on the image recording device by the optical system by means of the test structure; and
an arrangement recording an image produced on the image recording device by the optical system by means of the test structure in each of the at least two relative positions.

29. The apparatus for determining at least one optical property of an imaging optical system, the optical system being designed to image an object disposed in an object plane of the optical system into an assigned image plane, comprising:
at least one test structure;
an image recording device;
an arrangement disposing the at least one test structure in the object plane of the optical system and the image recording device in at least two different relative positions relative to the image plane of the optical system, and in each of the at least two relative positions, disposing the image recording device offset in relation to the image plane to such an extent that an image is respectively produced on the image recording device by the optical system by means of the test structure, wherein the maximum extension of the image exceeds a maximum extension of the image of the test structure in the image plane by at least one order of magnitude; and an arrangement recording an image produced on the image recording device by the optical system by means of the test structure in each of the at least two relative positions.

30. The apparatus according to claim 29, further comprising:
an evaluation device determining the at least one optical property of the optical system by evaluating the images recorded in the different relative positions.

31. A microlithography exposure tool with at least one of an illumination system and a projection objective, and with an apparatus according to claim 29 for determining an imaging property of the at least one of the illumination system and the projection objective.

* * * * *

UNITED STATES PATENT AND TRADEMARK OFFICE
CERTIFICATE OF CORRECTION

| | |
|---|---|
| PATENT NO. | : 7,760,345 B2 |
| APPLICATION NO. | : 11/942507 |
| DATED | : July 20, 2010 |
| INVENTOR(S) | : Matthias Manger et al. |

It is certified that error appears in the above-identified patent and that said Letters Patent is hereby corrected as shown below:

Column 6, Line 3: delete "$z_i$; i=1 ... 1" and insert -- $z_i$; i=1, ... $I$ --

Column 10, Line 41: delete "(e.g. a" and insert -- (e.g. σ --

Column 11, Line 55: delete "R(k, l: $z_i$)," and insert -- R(k, l; $z_i$), --

Column 11, line 56: delete "i=1, ... 1 of" and insert -- i=1, ... $I$ of --

Column 11, line 56: delete "$z_i$, i=1, ... 1" and insert -- $z_i$, i=1, ... $I$ --

Column 12, line 10: delete "$x_n$ (K, l: i)" and insert -- $x_n$ (k, l; i) --

Column 12, line 32: delete "X(k, l, i)" and insert -- X(k, l; i) --

Signed and Sealed this
Twenty-fifth Day of January, 2011

David J. Kappos
*Director of the United States Patent and Trademark Office*

UNITED STATES PATENT AND TRADEMARK OFFICE
CERTIFICATE OF CORRECTION

PATENT NO.        : 7,760,345 B2
APPLICATION NO.   : 11/942507
DATED             : July 20, 2010
INVENTOR(S)       : Matthias Manger et al.

It is certified that error appears in the above-identified patent and that said Letters Patent is hereby corrected as shown below:

Column 3, Line 28: delete "i.e. at least" and insert --i.e. at at least--

Column 16, Line 10: delete "optical system which is designed" and insert --optical system designed--

Signed and Sealed this
Twentieth Day of November, 2012

David J. Kappos
*Director of the United States Patent and Trademark Office*